(12) United States Patent
Manousakis et al.

(10) Patent No.: US 12,135,998 B2
(45) Date of Patent: Nov. 5, 2024

(54) MANAGING COMPUTATIONAL BURSTING ON SERVER NODES

(71) Applicant: Microsoft Technology Licensing, LLC, Redmond, WA (US)

(72) Inventors: Ioannis Manousakis, Redmond, WA (US); Husam Alissa, Redmond, WA (US); Ashish Raniwala, Bellevue, WA (US); Ricardo Gouvêa Bianchini, Bellevue, WA (US); Pulkit Ambikanandan Misra, Bellevue, WA (US); Inigo Goiri Presa, Redmond, WA (US); Majid Jalili, Austin, TX (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 734 days.

(21) Appl. No.: 17/186,856

(22) Filed: Feb. 26, 2021

(65) Prior Publication Data

US 2022/0276905 A1     Sep. 1, 2022

(51) Int. Cl.
*G06F 9/50*     (2006.01)
*G06F 9/455*    (2018.01)
(Continued)

(52) U.S. Cl.
CPC ........ *G06F 9/5077* (2013.01); *G06F 9/45558* (2013.01); *H04L 43/10* (2013.01);
(Continued)

(58) Field of Classification Search
None
See application file for complete search history.

(56) References Cited

U.S. PATENT DOCUMENTS

| 7,525,207 B2 | 4/2009 | Clidaras et al. |
| 8,862,914 B2 | 10/2014 | Kansal et al. |

(Continued)

OTHER PUBLICATIONS

Jalili, Majid, Ioannis Manousakis, Íñigo Goiri, Pulkit A. Misra, Ashish Raniwala, Husam Alissa, Bharath Ramakrishnan et al. "Cost-efficient overclocking in immersion-cooled datacenters." In 2021 ACM/IEEE 48th Annual International Symposium on Computer Architecture (ISCA), pp. 623-636. IEEE, 2021. (Year: 2021).*

(Continued)

*Primary Examiner* — Frank D Mills
(74) *Attorney, Agent, or Firm* — Ray Quinney & Nebeker; James Bullough (57) ABSTRACT

The present disclosure relates to systems, methods, and computer readable media for optimizing resource allocation on a computing zone based on bursting data and in accordance with an allocation policy. For example, systems disclosed herein may implement a lifetime-aware allocation of computing resources to facilitate computational bursting on respective server nodes to prioritize different aspects of performance on the server nodes of a cloud computing system. The systems described herein provide a number of benefits, including, by way of example, facilitating an allocation policy that enables more densely packing virtual machines on respective server nodes, boosting individual virtual machine performance, and reducing a buffer of empty nodes that need to be maintained on one or more node clusters. This may include more densely packing virtual machines on respective server nodes.

20 Claims, 7 Drawing Sheets

(51) Int. Cl.
  H04L 43/10 (2022.01)
  H04L 47/70 (2022.01)
  H05K 7/20 (2006.01)

(52) U.S. Cl.
  CPC ............. *H04L 47/82* (2013.01); *H05K 7/203* (2013.01); *H05K 7/20809* (2013.01); *G06F 2009/4557* (2013.01); *G06F 2209/501* (2013.01)

(56) References Cited

U.S. PATENT DOCUMENTS

| | | | | |
|---|---|---|---|---|
| 10,218,779 | B1* | 2/2019 | Cheng | H04L 67/1008 |
| 10,599,354 | B1* | 3/2020 | Greenwood | G06F 3/0613 |
| 10,613,888 | B1* | 4/2020 | Mentz | G06F 9/4401 |
| 2013/0086411 | A1 | 4/2013 | Bauer et al. | |
| 2015/0281015 | A1* | 10/2015 | Griffith | G06F 11/3452 709/224 |
| 2016/0301586 | A1* | 10/2016 | Bauer | H04L 43/0817 |
| 2018/0129243 | A1* | 5/2018 | Park | G06F 1/08 |
| 2018/0225149 | A1* | 8/2018 | Bianchini | G06F 9/5072 |
| 2018/0275893 | A1* | 9/2018 | Nguyen | G06F 11/3058 |
| 2021/0185850 | A1* | 6/2021 | Kulkarni | H05K 7/20327 |

OTHER PUBLICATIONS

"Gigabyte Collaborates with Incooling to Develop a New Class of Two-Phase Liquid Cooled Servers", Retrieved from: https://www.gigabyte.com/Press/News/1755, Jan. 14, 2020, 5 Pages.

Branscombe, Mary, "Five Reasons Data Center Liquid Cooling is on the Rise", Retrieved from: https://www.datacenterknowledge.com/power-and-cooling/five-reasons-data-center-liquid-cooling-rise, Jul. 23, 2018, 6 Pages.

"International Search Report and Written Opinion Issued in PCT Application No. PCT/US22/013776", Mailed Date: Apr. 12, 2022, 12 Pages.

"Accessing the VM Metadata Service (and user data fields) from Within the VM", Retrieved From: https://help.skytap.com/vm-accessing-vm-metadata-service-from-within-a-vm.html, Nov. 27, 2020, 4 Pages.

"Shared Computing Cluster (SCC)", Retrieved From: https://web.archive.org/web/20200511032825/https:/www.bu.edu/tech/services/research/computation/scc/, May 11, 2020, 3 Pages.

Abrams, John, "Tracking VM Power Consumption on PowerEdge Servers With OpenManage Power Center", Retrieved From: https://www.delltechnologies.com/en-us/blog/tracking-vm-power-consumption-on-poweredge-servers-with-openmanage-power-center/, Aug. 30, 2017, 2 Pages.

Avallone, et al., "A Low-Computational-Cost Inverse Heat Transfer Technique for Convective Heat Transfer Measurements in Hypersonic Flows", In The Journal of Experiments in Fluids, vol. 56, Issue No. 4, Apr. 14, 2015, 13 Pages.

Cai, et al., "GreenSprint: Effective Computational Sprinting in Green Data Centers", In The Proceedings of IEEE International Parallel and Distributed Processing Symposium, May 21, 2018, pp. 690-699.

Mittal, Sparsh, "Power Management Techniques for Data Centers: A Survey", In The Repository of arXiv:1404.6681v1, Apr. 26, 2014, 19 Pages.

* cited by examiner

MANAGING COMPUTATIONAL BURSTING ON SERVER NODES

BACKGROUND

A cloud computing system refers to a collection of computing devices on which data can be remotely stored and accessed. For example, modern cloud computing infrastructures often include a collection of physical network devices organized in a hierarchical structure. The collection of network devices may include computing zones, node clusters, virtual local area networks (VLANs), racks, fault domains, etc. Cloud computing systems often make use of different types of virtual services (e.g., computing containers, virtual machines) that provide remote storage and computing functionality to various clients and customers. These virtual services can be hosted by respective server nodes on a cloud computing system.

As demand for cloud computing resources continues to grow, costs associated with providing cloud computing resources has also increased. For example, because virtual machines often have performance guarantees, a certain quantity of computing resources are often left unused to ensure that these performance guarantees can be fulfilled. In addition, many datacenters or node clusters may maintain a buffer of unused computing capacity to ensure that unexpected events such as power disruptions or an unexpected influx of deployment requests do not result in failed deployments or unexpected outages of virtual machines. As cloud computing systems continue to grow in size and complexity, however, ensuring capacity in this way becomes extremely expensive as large quantities of server nodes and server cores are left unused.

Moreover, as cloud computing systems become more prevalent and widespread, devices must often be replaced to ensure reliability of the computing resources in providing various services. However, because different server nodes are often used in a variety of ways that may have disparate impacts on long-term dependability and hardware lifetimes, many server nodes are often discarded too early or remain in operation too long causing additional costs and other problems.

These and other problems exist with regard to managing power resources of cloud computing systems.

DETAILED DESCRIPTION

The present disclosure is generally related to an optimized resource allocation system that allocates computing resources on a computing zone (e.g., a node cluster, a grouping of node clusters or server racks, a datacenter) in accordance with an allocation policy. In particular, the resource allocation system may implement lifetime-aware allocation instructions to facilitate computational bursting on respective server nodes to boost performance of various services deployed on a cloud computing system. As will be discussed in further detail below, the resource allocation system implements an allocation policy that enhances performance of server node hardware in a variety of ways without significantly degrading lifetime (e.g., lifetime of reliability) of the server nodes. In one or more embodiments described herein, the resource allocation system leverages cooling capabilities by an efficient liquid cooling system that enables the server nodes to engage computational bursting for durations of time without causing a significant decrease in lifetime and reliability of the hardware.

As an illustrative example, in one or more embodiments, a resource allocation system may receive burst notifications from server nodes of a computing zone. As will be discussed below, the burst notifications may include information about instances in which the server nodes have engaged a computational bursting mode for some period of time. The resource allocation system may additionally maintain a computing zone record including computational bursting data for the computing zone. The resource allocation system may receive and process a customer request to deploy a virtual machine or other cloud-based service on the computing zone. In one or more embodiments, the resource allocation system may identify one or more server nodes on which to deploy the virtual machine (or other cloud-based service) to facilitate deployment of the virtual machine in accordance with an allocation policy.

As will be discussed in further detail below, the present disclosure includes a number of practical applications having features described herein that provide benefits and/or solve problems associated with optimizing use of computing resources on a computing zone of a cloud computing system. Some example benefits are discussed herein in connection with various features and functionalities provided by the resource allocation system. Nevertheless, it will be appreciated that benefits explicitly discussed in connection with one or more embodiments herein are provided by way of example and are not intended to be an exhaustive list of all possible benefits of the resource allocation system.

For example, features and functionality described herein can enhance performance of virtual machines deployed on server nodes of the cloud computing system. For example, the resource allocation system can deploy virtual machines on a server node and provide instructions in accordance with an allocation policy that facilitates selective computational bursting on the server nodes. As will be discussed below, this selective computational bursting can provide more reliable guarantees of virtual machine performance while accounting for any decreases in hardware lifetime (and in some cases, without sacrificing hardware lifetime).

As another example, the resource allocation system can facilitate more efficient use of hardware on a computing zone. For instance, the resource allocation system can provide instructions from an allocation policy that causes server nodes to densely pack virtual machines on compute cores of respective server nodes. In addition to more densely packing virtual machines on respective nodes, the resource allocation system can provide allocation instructions in accordance with an allocation policy that enables the computing zone to satisfy buffer requirements (e.g., a requirement that a minimum threshold of available computing capacity is maintained) while maintaining a fewer number of empty server nodes for a given computing zone.

In each of the above examples, the resource allocation system can facilitate more efficient use of computing resources while minimizing or otherwise accounting for a reduced lifetime of the server node hardware. For example, in one or more embodiments described herein, the server nodes of a computing zone are cooled using an immersion cooling system that enables the server nodes to operate at a cooler temperature than conventional systems. This lower operating temperature not only lengthens the lifetime of reliability for the server nodes under normal operating conditions, but further enables the server nodes to engage computational bursting without reducing lifetime of the server node hardware below a standard equipment lifetime of the server nodes.

Further, by collecting computational bursting data in accordance with one or more embodiments, the resource allocation system can make allocation decisions based on historical bursting data locally tracked or otherwise observed by the server nodes on the computing zone. For example, the resource allocation system can ensure that critical virtual machines (e.g., high priority virtual machines, virtual machines with low tolerance for service interruptions, virtual machines having higher availability guarantees) are deployed on server nodes that have a longer remaining lifetime (or are otherwise associated with a higher level of reliability). The resource allocation system can alternatively allocate computing resources for less critical services on other server nodes that may be nearing the end of the hardware lifetime or may be associated with a lower level of reliability.

In each of the above examples, the resource allocation system can significantly save on costs associated with powering hardware of the computing zone as well as costs associated with replacing server nodes over time. Moreover, the examples described herein may enable the resource allocation system to predict computing capacity more aggressively, thus enabling the resource allocation system to save costs associated with unused resources on the cloud computing system.

As illustrated in the foregoing discussion, the present disclosure utilizes a variety of terms to described features and advantages of the systems described herein. Additional detail is now provided regarding the meaning of some of these terms. For example, as used herein, a "cloud computing system" may refer to a network of connected computing devices that provide various services to clients (e.g., external or internal clients of the cloud computing system). For instance, as mentioned above, a cloud computing system can include a collection of physical network devices (e.g., server nodes) organized in a hierarchical structure including clusters, computing zones, virtual local area networks (VLANs), racks, fault domains, etc.

As used herein, a "virtual machine" or "VM" refers to an emulation of a computer system on a server node that provides functionality of one or more applications on the cloud computing system. Virtual machines can provide functionality needed to execute one or more operating systems. In addition, virtual machines can make use of hypervisors on processors of server nodes that support virtual replication of hardware. In one or more embodiments described herein, the hypervisors implement the allocation policies on the respective server nodes in accordance with allocation instructions received from the resource allocation system.

As used herein, a "computing zone" may refer to a grouping of one or more server nodes of a cloud computing system. For example, a computing zone may refer to a node cluster or multiple node clusters associated with a resource allocation system. In one or more embodiments, a computing zone may refer to a datacenter including any number of node clusters. In one or more embodiments, a computing zone refers to a discrete grouping of server nodes that are cooled by a cooling system (e.g., server nodes within a cooling tank of an immersive cooling system). In one or more embodiments, a computing zone refers to one or multiple server racks including any number of server nodes thereon. Indeed, a computing zone may refer to a grouping of nodes including any number of server nodes that are serviced by a respective resource allocation system (e.g., one or more allocation engines having access to a common computing zone record).

As used herein, "computational bursting" may refer to an act by a server node in which one or more processors on the server node are directed to process data at a speed above an identified frequency. For example, computational bursting may refer to one or more processors being overclocked or processing data at or above an identified threshold frequency. As a non-limiting example, where a processor of a server node is configured to operate at or below a nominal frequency of three (3) gigahertz (GHz) under typical conditions (e.g., when cooled using an air cooling system), causing the processor of the server node to engage operation at any level above 3 GHz may refer to a computational bursting mode (e.g., any level above the nominal frequency). As will be discussed in further detail below, the threshold for computational bursting may change depending on a type of cooling system and/or various specifications of an associated device. For example, a computational bursting threshold may be 3 GHz for a server node operating in an air-cooling environment and 3.3 GHz for a similar server node in an immersion cooling environment that maintains a lower operating temperature of the server node hardware. Moreover, a server node may include different levels of computational bursting corresponding to different ranges of frequencies.

In one or more embodiments, computational bursting may refer to a level of operation that, when engaged for a duration of time, causes a lifetime of the server node to decrease, particularly when that level of operation is engaged for a sustained duration of time. For instance, similar to the above example, a computational bursting mode may refer to the compute core operating at or above 3.3 GHz (or other determined threshold) for some predetermined duration of time. As will be discussed in further detail herein, a server node may be configured to operate at multiple computational bursting modes corresponding to different thresholds that may have different measures of impact on a lifetime of a server node. (e.g., higher processing frequencies having a more negative impact on lifetime than lower processing frequencies)

As used herein, a "burst notification" may refer to any communication between a server node and a resource allocation system in which information about one or more instances of computational bursting is communicated between components of a cloud computing system. For example, in one or more embodiments described herein, a server node may communicate a burst notification to the resource allocation system responsive to the server node engaging or completing engagement of a computational bursting node on one or more compute cores of the server node. As will be discussed in further detail below, the burst notification may include various information about the computational bursting instance(s), including a level of the computational bursting (e.g., a frequency that a processor was overclocked) and/or a duration of time that the computational bursting mode was engaged.

As used herein, a "computing zone record" refers to a content item including information about computational bursting for a computing zone. For example, a computing zone record may refer to a file, table, database, or other data object(s) including information about server nodes from a computing zone that have engaged computational bursting. The computing zone record may include a history of computational bursting instances over any duration of time thus providing an indication of which server nodes have engaged a computational bursting mode over time as well as any information associated therewith (e.g., duration of the computational bursting instances, frequency at which processor(s) were overclocked during the respective instances). In one or more embodiments, the computing zone record provides an indication of estimated lifetime for the server nodes based at least in part on the computational bursting data obtained over time.

Figure 1:
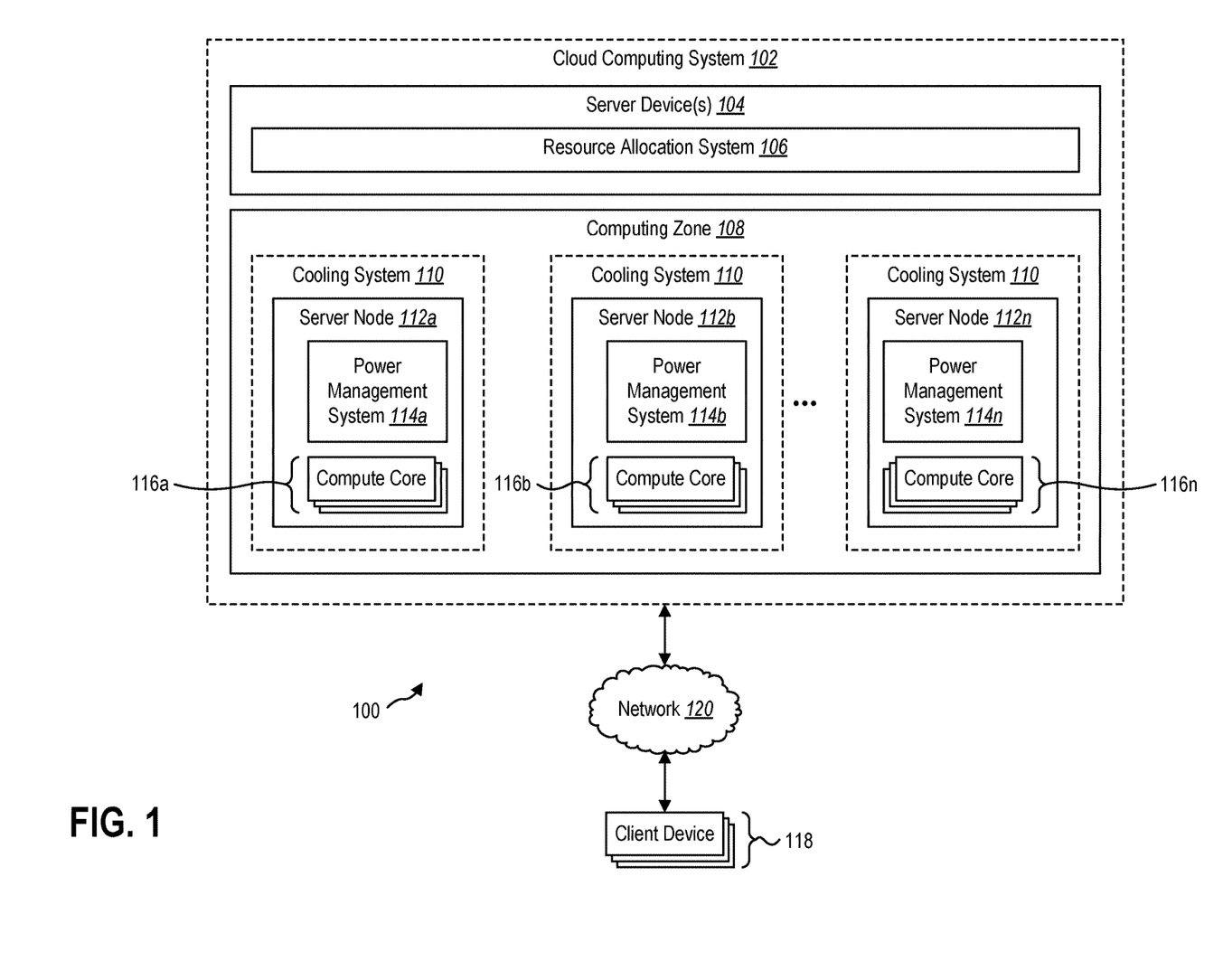
FIG. 1 illustrates an example environment of a cloud computing system including a resource allocation system in accordance with one or more embodiments.

Additional detail will now be provided regarding a resource allocation system on a cloud computing system in relation to illustrative figures portraying example implementations. For example, FIG. 1 illustrates an example environment 100 including a cloud computing system 102. The cloud computing system 102 may include any number of devices. For example, as shown in FIG. 1, the cloud computing system 102 includes one or more server device(s) 104 having a resource allocation system 106 implemented thereon. As will be discussed in further detail below, the resource allocation system 106 can receive burst notifications from devices of the cloud computing system 102 to use in making allocation determinations and generating allocation instructions in accordance with an allocation policy.

As shown in FIG. 1, the cloud computing system 102 further includes a computing zone 108 having any number of server nodes 112a-n. In one or more embodiments, the server nodes 112a-n are cooled by a cooling system 110. As shown in FIG. 1, each of the server nodes 112a-n may be cooled using different cooling mechanisms. Alternatively, one or more of the server nodes 112a-n may be cooled using a common or shared cooling system 110 (e.g., an immersion tank within which multiple server nodes 112a-n can be placed).

As shown in FIG. 1, the cloud computing system 102 includes any number of server nodes 112a-n. The server nodes 112a-n may refer to a variety of network devices of a datacenter, a region of datacenters, nodes of a server rack, or any other grouping of devices serviced by a resource allocation system 106. As mentioned above, the computing zone 108 may include any grouping of server nodes 112a-n ranging from a single node cluster to multiple node clusters within a datacenter. In one or more embodiments, the computing zone 108 refers to a set of hardware cooled within a cooling system 110, which may include one or multiple cooling devices (e.g., immersion cooling tanks).

As shown in FIG. 1, each of the server nodes 112a-n may include power management systems 114a-n and compute cores 116a-n implemented thereon. By way of example, a first server node 112a may include a power management system 114a and compute cores 116a implemented thereon. As will be discussed in further detail below, the power management system 114a may track and provide burst notification to the resource allocation system 106 for use in performing various allocation actions. In addition, the compute cores 116a may be used to host one or more virtual machines in accordance with an allocation policy maintained and implemented by the resource allocation system 106. It will be understood that each of the additional server nodes 112b-n may include feature variations, such as different applicable allocation rules or policies and/or different types or numbers of compute cores. Nevertheless, features and functionality discussed in connection with specific example power management systems may apply to any of the respective power management systems on the corresponding server nodes.

As further shown in FIG. 1, the environment 100 includes client devices 118 in communication with the cloud computing system 102. The client devices 118 may refer to various types of client devices capable of accessing data and various services on the cloud computing system 102. For instance, a client device may refer to a mobile device such as a mobile telephone, a smart phone, a personal digital assistant (PDA), a tablet, a laptop, or wearable computing device (e.g., a headset or smartwatch). A client device may also refer to a non-mobile device such as a desktop computer, a server node (e.g., from another cloud computing system), or other non-portable device. The client devices 118, server device(s) 104, and server nodes 112a-n may include additional features and functionality as generally discussed below in connection with FIG. 6.

The network 120 may include one or multiple networks that use one or more communication platforms or technologies for transmitting data. For example, the network 120 may include the Internet or other data link that enables transport of electronic data between respective client devices 118 and components (e.g., server device(s) 104 and/or server nodes 112a-n hosting virtual machines thereon) of the cloud computing system 102.

Figure 2:
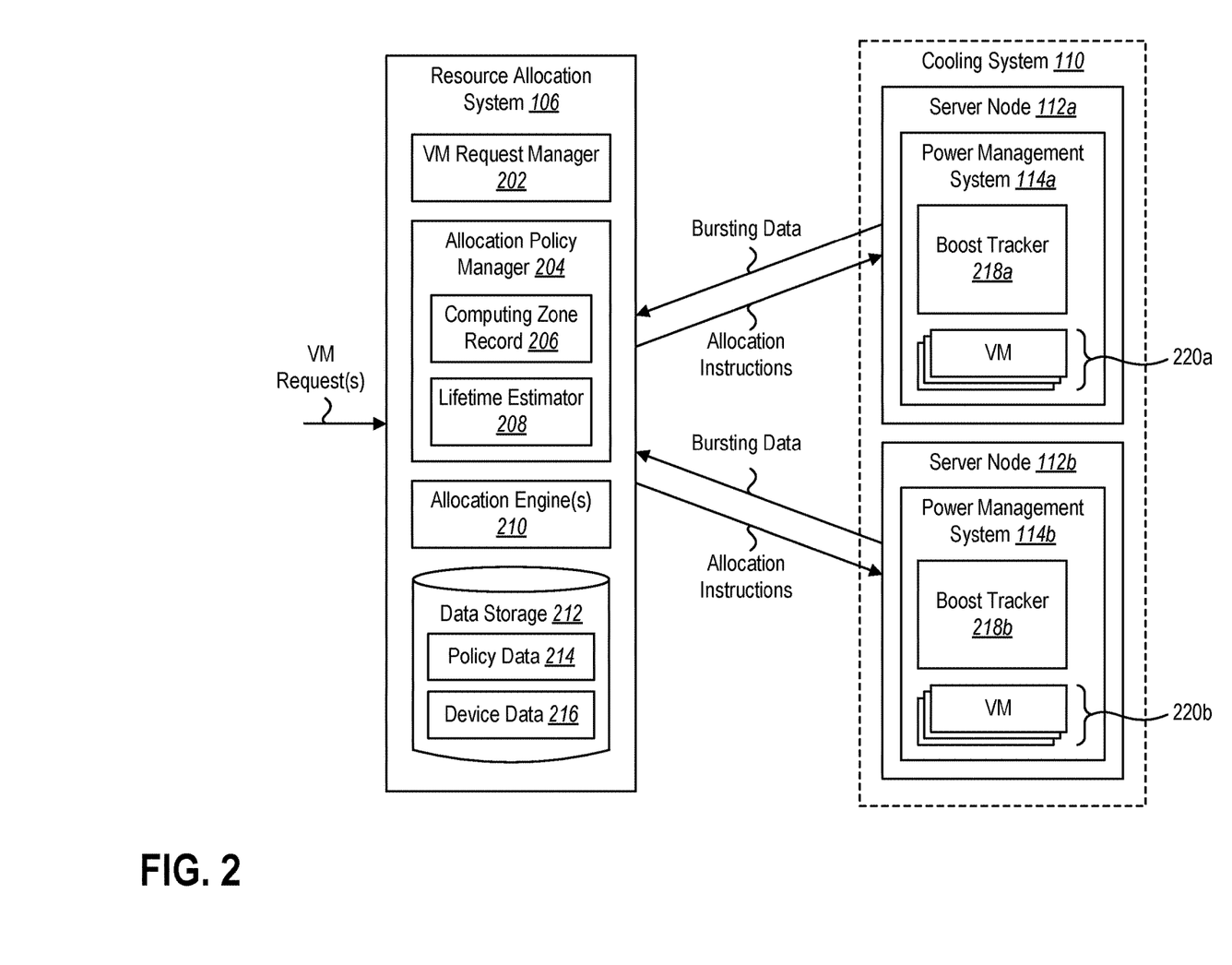
FIG. 2 illustrates an example implementation of the resource allocation system in accordance with one or more embodiments.

Additional detail will now be discussed in connection with the various systems in accordance with one or more embodiments herein. For example, FIG. 2 illustrates an example implementation showing the resource allocation system 106 and example server nodes 112a-b having power management systems 114a-b implemented thereon. The resource allocation system 106 and power management systems 114a-b may have the same or similar features as corresponding components discussed above and illustrated in FIG. 1.

As shown in FIG. 2, the resource allocation system 106 can include a virtual machine (VM) request manager 202 and an allocation policy manager 204. The allocation policy manager may include a computing zone record 206 and a lifetime estimator 208. As further shown, the resource allocation system 106 may include one or more allocation engine(s) 210. The resource allocation system 106 may also include a data storage 212 having policy data 214 device data 216 and any additional data accessible to the various components of the resource allocation system 106.

As shown in FIG. 2, the power management systems 114a-b may include additional components that act in cooperation with the components 202-210 of the resource allocation system 106. For example, a first power management system 114a on a first server node 112a may include a burst tracking manager 218a for tracking instances in which the first server node 112a engages a computational bursting mode. As further shown, the first server node 112a may include a number of VMs 220a deployed thereon. A second power management system 114b may include similar components as the first power management system 114a. For example, the second power management system 114b may include a boost tracker 218b and VMs 220b hosted by the second server node 112b.

As noted above and as shown in FIG. 2, one or both of the server nodes 112a-b may include hardware that is cooled by a cooling system 110. The cooling system 110 may refer to a variety of cooling mechanisms for maintaining an operational temperature of the server nodes 112a-b at a reduced temperature that lengthens a lifetime of the respective devices. In one or more embodiments, the cooling system 110 refers to an immersion cooling system, where device hardware (e.g., a printed circuit board (PCB) assembly) is immersed in a dielectric working fluid that absorbs the heat generated by the device hardware. In some embodiments, the immersion cooling system may be a two-phase immersion cooling system. In a two-phase cooling system, the device hardware is immersed in a working fluid which has a relatively low boiling point. As the temperature of the hardware rises, the heat generated by the heat generating components on the device hardware may cause the working fluid to change phases (e.g., boil). The boiling of the working fluid may absorb the generated heat, thereby cooling the device hardware. In a single-phase immersion cooling system, the device hardware is immersed in a working fluid which does not change phase. The fluid may be circulated across the device hardware to carry away the heat.

In one or more embodiments, the cooling system 110 maintains a temperature of electrical components on the server nodes 112a-b at a temperature below a first threshold. In particular, in one or more embodiments, the cooling system 110 maintains a temperature at a first level that lengthens a lifetime of the server nodes 112a-b by some amount (e.g., 1 year) beyond a standard equipment lifetime when operating under normal operating conditions. As used herein, a normal operating frequency may refer to some standard frequency (e.g., 3 GHz) that a server node is configured to operate at indefinitely for a standard equipment lifetime. In one or more embodiments, the cooling system 110 enables the server nodes 112a-b to operate an elevated operating frequency above the standard operating frequency (e.g., 3.3 GHz or other elevated operating frequency above a normal operating frequency) without sacrificing a lifetime of the hardware and, in many cases, still benefiting from the cooling system 110 extending a lifetime of the hardware beyond a standard equipment lifetime.

In addition, in one or more embodiments, the cooling system 110 enables the server nodes 112a-b to operate in a computational bursting mode in which processors of the server nodes 112a-b run at a bursting speed (e.g., above the standard or elevated operating frequency). As used herein, a bursting speed refers to a speed at which one or more processors are running to boost performance of the server nodes 112a-b temporarily, but at the expense of a standard lifetime of the server nodes 112a-b. As used herein, a bursting speed may refer to any speed above an operational frequency. Alternatively, where the cooling system 110 refers to a two-phase immersive cooling system, the bursting speed may refer to any speed above the elevated operating frequency. As noted above, the cooling system 110 maintains the temperature of the server node hardware at a lower temperature over periods of time when operating at a normal operating frequency. As a result, even where the server nodes 112a-b may operate at the bursting frequency for extended periods of time or on a regular basis, the server nodes 112a-b may nonetheless enjoy lifetimes comparable to the standard equipment lifetime of the hardware and, in many cases, longer than standard equipment lifetimes for devices cooled by conventional cooling mechanisms.

As mentioned above, the resource allocation system 106 and the power management systems 114a-b may cooperatively optimize allocation of computing resources on the server nodes 112a-b based on durations of time that the server nodes 112a-b engage computational bursting modes. Indeed, as will be discussed in connection with various examples, the resource allocation system 106 may make allocation decisions and process incoming VM requests based on estimated lifetimes for the respective devices and in accordance with an allocation policy implemented thereon.

For example, as mentioned above, the resource allocation system 106 may include a VM request manager 202. The VM request manager 202 may manage receipt and processing of VM requests. In particular, the VM request manager 202 may receive any number of VM requests from the client devices 118 in communication with the cloud computing system 102. In addition, the VM request manager 202 can receive VM requests from internal devices within the cloud computing system 102. The VM requests may include information about a customer as well as a type or size of a VM requested. In addition, the VM request(s) may include an indication of one or more service level guarantees (SLA) that may be used by additional components in identifying computing resources on the computing zone 108 to use in deploying the requested VMs. In one or more embodiments, the VM request manager 202 gather any relevant information about the VM request(s) and provides the request information to additional components of the resource allocation system 106 for further processing.

The allocation policy manager 204 can perform a number of acts related to selectively identifying and allocating computing resources on the server nodes 112a-b responsive to incoming VM requests. To illustrate, as shown in FIG. 2, the allocation policy manager 204 can maintain a computing zone record 206 including information collected about computational bursting on the server nodes 112a-b.

As shown in FIG. 2, the allocation policy manager 204 can receive bursting data from the server nodes 112a-b. In one or more embodiments, the allocation policy manager 204 receives the bursting data by collecting burst notifications from each of the server nodes 112a-b responsive to specific instances in which the server nodes 112a-b engage a computational bursting mode. For example, the first server node 112a may engage a computational bursting mode for a duration of time and provide a burst notification indicating that the computational bursting mode was engaged on the first server node 112a.

The burst notification may include additional information (e.g., beyond a simple indication that computational bursting was engaged), including a tracked duration of time that the computational bursting was engaged as well as a level of the computational bursting. For example, in one or more embodiments, the server node 112a may be configured to engage multiple modes of computational bursting having different ranges of processing frequency. For instance, the server node 112a may be configured to engage a first computational bursting mode having a frequency between an operating frequency (e.g., 3 GHz) and a first threshold frequency (e.g., 3.3 GHz). The server node 112a may also be configured to engage a second computational bursting mode having a frequency between the first threshold frequency (e.g., 3.3 GHz) and a second threshold frequency (e.g., 4 GHz). In some implementations, the server node 112 may be configured to engage a third computational bursting mode above the second threshold frequency to some upper limit tied to a computational capacity of the hardware. One or more implementations may include any number of ranges of frequency.

Each of the ranges of frequency may be associated with a corresponding lifetime effect. For example, causing the server nodes 112a-b to engage a computational bursting mode may have an associated effect on a predicted lifetime of the hardware on the server nodes 112a-b. In addition, the specific effect on the lifetime may depend on various factors including how long the server node(s) engaged the computational bursting mode and whether the computational bursting mode was a first or second computational bursting mode.

As shown in FIG. 1, the allocation policy manager 204 can collect bursting data and include the bursting data within a computing zone record 206. The computing zone record 206 may include a record of historical data associated with instances in which the server nodes 112a-b have engaged the computational bursting mode. The computing zone record 206 may additionally include any information about the tracked instances including durations of time and indications of different modes corresponding to different ranges of processor frequencies.

The allocation policy manager 204 can receive the bursting data in a variety of ways. For example, in one or more embodiments, the boost trackers 218a-b may detect an instance of computational bursting and provide an indication of the instance(s) to the allocation policy manager 204 for inclusion within the computing zone record 206. In one or more embodiments, the boost trackers 218a-b maintain a local count and/or duration of time that the corresponding hardware has engaged the computational bursting modes. In one or more embodiments, the allocation policy manager 204 receives or collects periodic updates generated and provide by the boost trackers 218a-b. In one or more embodiments, a count of computational bursting instances and associated information is maintained locally and exposed to the allocation policy manager 204 to enable the allocation policy manager 204 to read a local count of computational bursting. In one or more embodiments, the allocation policy manager 204 may check the local count of computational bursting instances responsive to receiving a VM request from a client to consider in selectively identifying a computing resource for deploying of the VM(s).

In addition to information about the computational bursting, the allocation policy manager 204 may include lifetime data within the computing zone record 206. For example, in one or more embodiments, the lifetime estimator 208 may compile historical data for corresponding hardware (e.g., server nodes and/or compute cores thereon) and determine an estimated lifetime based on received bursting data. In one or more embodiments, the lifetime estimator 208 tracks estimated reductions based on durations of time and a number of tracked instances that the server nodes 112a-b engage the computational bursting modes. In one or more embodiments, the lifetime estimator 208 periodically updates estimated lifetimes based on additional data received or otherwise obtained by the allocation policy manager 204.

As shown in FIG. 2, the resource allocation system 106 includes one or more allocation engine(s) 210. The allocation engine(s) 210 can implement an allocation policy and selectively identify computing resources on the server nodes 112a-b for deploying the VMs 220a-b. In one or more embodiments, the allocation engine(s) 210 evaluates the VM request and identifies a server or compute core on which to place the VM based on a combination of the bursting data (and/or estimated lifetime data) and the allocation policy applicable to the computing zone 108. In one or more embodiments, the allocation engine(s) 210 additionally determines allocation of computing resources based on information received from the VM request(s).

As an example, an allocation policy may include any number of rules that indicate one or more priorities that the allocation engine(s) 210 should pursue in making allocation determinations. For instance, in one or more embodiments, the computing zone 108 may have a rule indicating a priority of extending the lifetime of the server nodes 112a-b thereon. In this example, the allocation engine(s) 210 may receive a VM request and identify any server node on the computing zone 108 having a sufficient number of compute cores to host the VM without causing the server node(s) to engage computational bursting on a regular basis. As an example, where the first server node 112a includes a higher number of VMs 220a thereon and where adding an additional VM would cause the first server node to engage computational bursting more frequently, the allocation engine(s) 210 may instead identify computing resources on the second server node 112b to use in processing the VM request(s). In this example, the allocation engine(s) 210 would generate and provide allocation instructions indicating one or more rules from the allocation policy for the power management system 114b to enforce on the second server node 112b.

As another example, in one or more embodiments, the allocation policy may have a rule to prioritize certain VMs of certain types, such a critical VM having low tolerance for interruption or reduced performance or VM types having a certain service level agreements (SLAs) or quality of service (QoS) guarantees are request by a client making the request. In accordance with the allocation policy, the allocation engine(s) 210 may identify a server node having a sufficient number of compute cores to allow the VM to engage computational bursting without interfering with functionality of other VMs on the server node. As an example, where the first server node 112a includes a sufficient number of compute cores (e.g., where the first server node 112a is an empty node or has a small number of VMs thereon), the allocation engine(s) 210 can allocate compute cores on the server node 112a for use in deploying a VM thereon. The allocation engine(s) 210 may further provide allocation instructions indicating a priority level of the VM to use in permitting the VM to engage computational bursting on an as-needed or regular basis.

As another example, in one or more embodiments, the allocation policy may have a rule to prioritize density with which VMs are deployed on the server nodes 112a-b. In accordance with the allocation policy, the allocation engine(s) 210 can identify a server node on which deploying a requested VM would cause the server node to occupy a high percentage of compute cores rather than selecting one or more server nodes that are empty or have more than enough compute cores available for VM hosting purposes.

In this example, the allocation engine(s) 210 may identify a server node with a number of VMs already hosted thereon and operating at or near the operational frequency such that deployment of additional VM(s) thereon would cause the server node to engage computational bursting on a regular basis (thus decreasing an estimated lifetime of the server node). Accordingly, in one or more embodiments, the allocation engine(s) 210 may provide allocation instructions that cause the server node to engage computational bursting on a regular basis to accommodate a higher density of VMs deployed thereon.

In one or more embodiments, the resource allocation system 106 determines to apply the rule prioritizing VM density based on one or more characteristics of the VM request(s). For example, in one or more embodiments, the resource allocation system 106 determines that the VM type for the VM request(s) is a non-critical VM type, such as a non-user facing VM or a service capable of running in the background on a flexible processing schedule. In this case, the resource allocation system 106 may prioritize densely packing the VMs on server nodes based on this determination of the VM type being non-critical. Alternatively, where the VM request(s) is a critical VM type, such as a user-facing service, a VM type having low tolerance for outages or reduced processing availability, or a VM type having a specific SLA or QoS guarantee, the resource allocation system 106 can implement one or more rules prioritizing VM performance rather than VM density.

In each of the above cases, the allocation engine(s) 210 can provide allocation instructions to the respective server nodes 112a-b indicating one or more specific rules that are applicable to the VM to be deployed on the server nodes 112a-b. The allocation instructions may indicate rules associated with when and how long to engage computational bursting on the server nodes 112a-b. In one or more embodiments, the allocation instructions may include information about the VMs to be deployed on the server nodes 112a-b and the power management systems 114a-b can implement allocation policies maintained on the respective server nodes 112a-b.

In one or more embodiments, the resource allocation system 106 implements a combination of the above rules for a given computing zone 108. For example, the resource allocation system 106 may prioritize VM performance on a first grouping of server nodes while prioritizing packing density of VMs on a second grouping of server nodes. Alternatively, the resource allocation system 106 can prioritize some combination of optimizations of performance and/or density while attempting to extend or otherwise take advantage of extended lifetimes of various devices.

As shown in FIG. 2, the resource allocation system 106 can include a data storage 212. In one or more embodiments, the data storage 212 includes policy data 214. The policy data 214 may include any information about an allocation policy including various allocation rules and priorities associated with different server nodes 112a-b and/or lifetimes of the respective hardware. The policy data 214 may additionally include rules or algorithms for determining which allocation rules or policies should apply to different virtual machines. In one or more embodiments, at least a portion of the policy data 214 is stored and maintained on the respective server nodes 112a-b for use in determining when and how long to engage computational bursting modes on the respective server nodes 112a-b.

As further shown, the data storage 212 includes device data 216. The device data 216 may include any information associated with the server nodes 112a-b and/or compute cores thereon. For example, the device data 216 may include estimated lifetimes based on bursting data received from the server nodes 112a-b. The device data 216 can include an indication of available compute cores on the respective server nodes 112a-b. Indeed, the device data 216 may include any information about the devices of the computing zone 108 for use in determining estimated lifetimes and/or making allocation decisions.

Figure 3A:
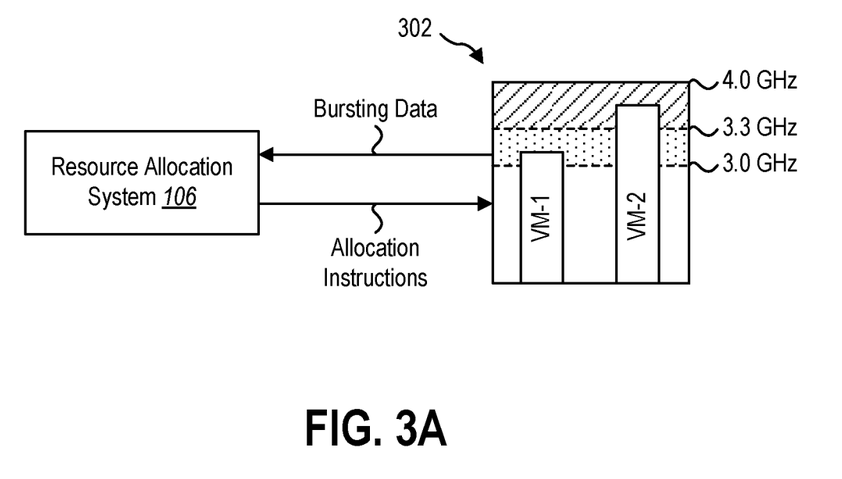
FIG. 3A illustrates an example implementation in which a resource allocation system causes compute cores to engage lifetime-aware computational bursting to enhance computing performance in accordance with one or more embodiments.
Figure 3B:
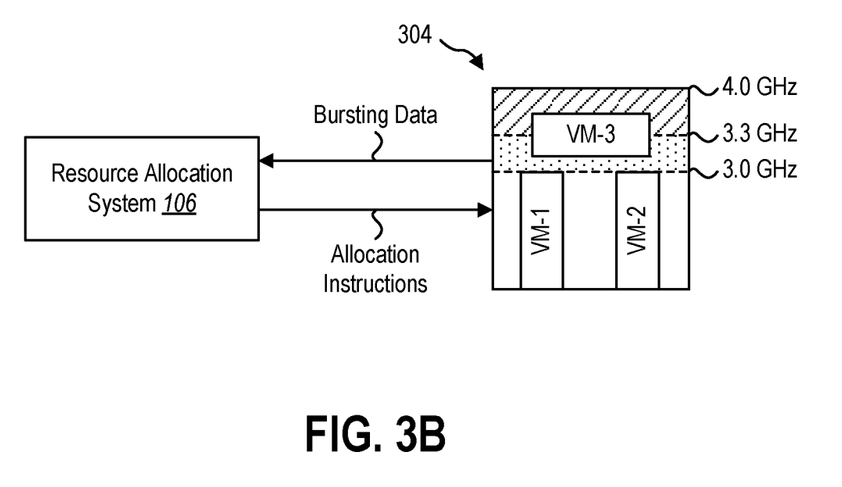
FIG. 3B illustrates an example implementation in which a resource allocation system causes compute cores to engage lifetime-aware computational bursting to densely pack virtual machines in accordance with one or more embodiments.
Figure 3C:
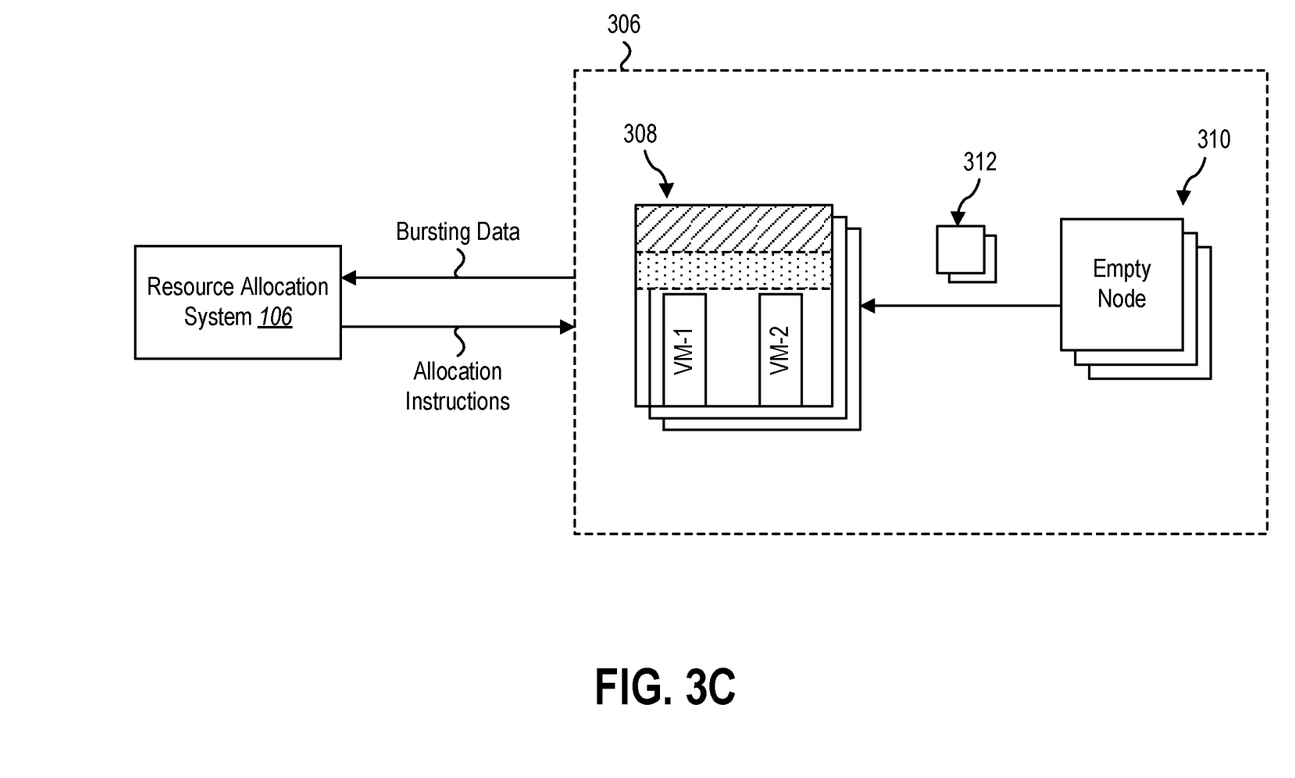
FIG. 3C illustrates an example implementation in which a resource allocation system causes compute cores to engage lifetime-aware computational bursting to reduce a node buffer on a computing zone in accordance with one or more embodiments.

Moving on, FIGS. 3A-3C illustrate a number of example use-cases in which the resource allocation system 106 gathers bursting information and selectively identifies computing resources on which to host one or more VMs. For example, FIG. 3A illustrates an example implementation showing a resource allocation system 106 that receives bursting data associated with compute cores of a server node. As further shown, the resource allocation system 106 can provide allocation instructions indicating rules and other information to govern instances in which the server node engages one or more computational bursting modes.

In this example, the resource allocation system 106 causes one or more VMs (VM-1 and VM-2) to be deployed on a set of compute cores 302. As shown in FIG. 3A, the resource allocation system 106 may provide allocation instructions indicating that performance of the VMs should be optimized on the set of compute cores 302. As shown in FIG. 3A, the compute cores 302 may engage a computational bursting mode in which the compute cores 302 operate at above a 3.3 GHz threshold frequency to increase performance associated with the second virtual machine while the first virtual machine maintains operation within a frequency range of a normal operation of the compute cores 302.

In this example, the compute cores 302 may engage a computational bursting mode above a 3.3 GHz threshold in which a predicted lifetime decreases over time with prolonged durations that the compute cores 302 engage the computational busting mode. In one or more embodiments, the compute cores 302 may engage above a second threshold (e.g., 4.0 GHz) for some period of time to achieve higher computational performance. This increased frequency may further decrease an expected lifetime of the compute cores 302 (e.g., at an accelerated rate over a computational bursting mode in which the compute cores 302 operate between 3.3 GHz and 4.0 GHz). In one or more embodiments, the resource allocation system 106 provides allocation instructions that regulate when and how often the compute cores engage the different computational bursting modes. As shown in FIG. 3B, the compute cores 302 can provide burst notifications indicating the instances and associated durations that the compute cores 302 engage the computational bursting mode(s). The resource allocation system 106 may use the historical bursting data to make allocation decisions responsive to received VM requests.

FIG. 3B illustrates another example use case in which the resource allocation system 106 receives bursting data from a set of compute cores 304. Similar to above examples, the resource allocation system 106 may maintain a record of the bursting data, determine estimated lifetimes of the compute cores 304 and make allocation decisions based on the historical bursting data, estimated lifetimes, and rules of an allocation policy for an associated computing zone.

In this example, the resource allocation system 106 causes one or more VMs (VM-1, VM-2, and VM-3) to be deployed on a set of compute cores 304. As shown in FIG. 3B, the resource allocation system 106 may provide allocation instructions indicating that packing density of the VMs should be optimized on the set of compute cores 304. As shown in FIG. 3B, densely packing the VMs on the compute cores may cause the compute cores 304 to engage computational bursting modes to meet the demands of a greater than normal number of VMs implemented on the corresponding set of compute cores 304. In this example, the resource allocation system 106 may ignore a per-device buffer requirement that typically ensures that a certain amount of compute capacity remains unused. While this may have a negative impact on overall lifetime of the compute cores 304, the compute cores 304 may nonetheless optimize density of the VMs based on the allocation policy and in view of the compute cores being cooled by an efficient cooling mechanism described above.

As shown in FIG. 3, the compute cores 304 may engage computational bursting above a threshold of 3.0 GHz, and even above a second threshold of 3.3 GHz based on the additional computing capacity needed to maintain operation of the densely packed VMs on the compute cores 304. In accordance with one or more embodiments, the compute cores 304 may generate and provide burst notifications to the resource allocation system 106 to be stored within a computing zone record on the resource allocation system 106. The resource allocation system 106 may then use the data on the computing zone record for allocation decisions on the compute cores 304 and other compute cores of the computing zone 108.

FIG. 3C illustrates another example use case in which the resource allocation system 106 receives bursting data from a set of compute cores (e.g., within a computing zone 306). Similar to the above examples, the resource allocation system 106 maintains a record of bursting data and makes allocation decisions based on the bursting data in view of an allocation policy.

In this example, the resource allocation system 106 allocates computing resources on a computing zone 306 beyond a typical buffer of computing capacity for the computing zone 306. For example, in one or more embodiments, a computing zone 306 may have a storage policy that allows a certain number of allocated cores 308 up to a buffer such that a threshold number of empty nodes 310 (or threshold number of cores) remain unused. This may enable the computing zone 306 to tolerate some number of compute cores going down unexpectedly and/or maintenance to be performed on the computing zone 306.

As a result of some of the example benefits and features discussed above in connection with the resource allocation system 106, the resource allocation system 106 may cause a number of additional compute cores 312 (and/or additional nodes from the empty nodes 310) to be allocated for hosting virtual machines on the computing zone 306. For example, where the computing zone 306 may have a buffer of empty nodes 310, the resource allocation system 106 may identify one or more additional empty cores 312 (and/or nodes) to use for hosting VMs without violating one or more minimum buffer policies of the computing zone 306. For instance, where the computing zone may typically have a requirement that fifty compute cores remain empty and ready for emergency allocation, the resource allocation system 106 can identify some portion of the fifty compute cores for allocation of additional VMs.

In this scenario, where the computing zone 306 experiences some emergency that merits use of the set of empty nodes 310, the allocation instructions may include instructions causing the occupied cores 308 to host one or more additional VMs beyond a typical per-server node capacity based on the detected emergency. For example, the set of occupied cores 308 may implement features of the densely packed compute cores discussed above in connection with FIG. 3B to compensate for a fewer number of empty nodes 310 as a result of the additional compute cores 312 being allocated for hosting VMs. In one or more embodiments, this dense packing of VMs may be performed temporarily until an emergency scenario or other maintenance action is resolved before migrating one or more of the VMs to additional empty nodes that become available.

Figure 4:
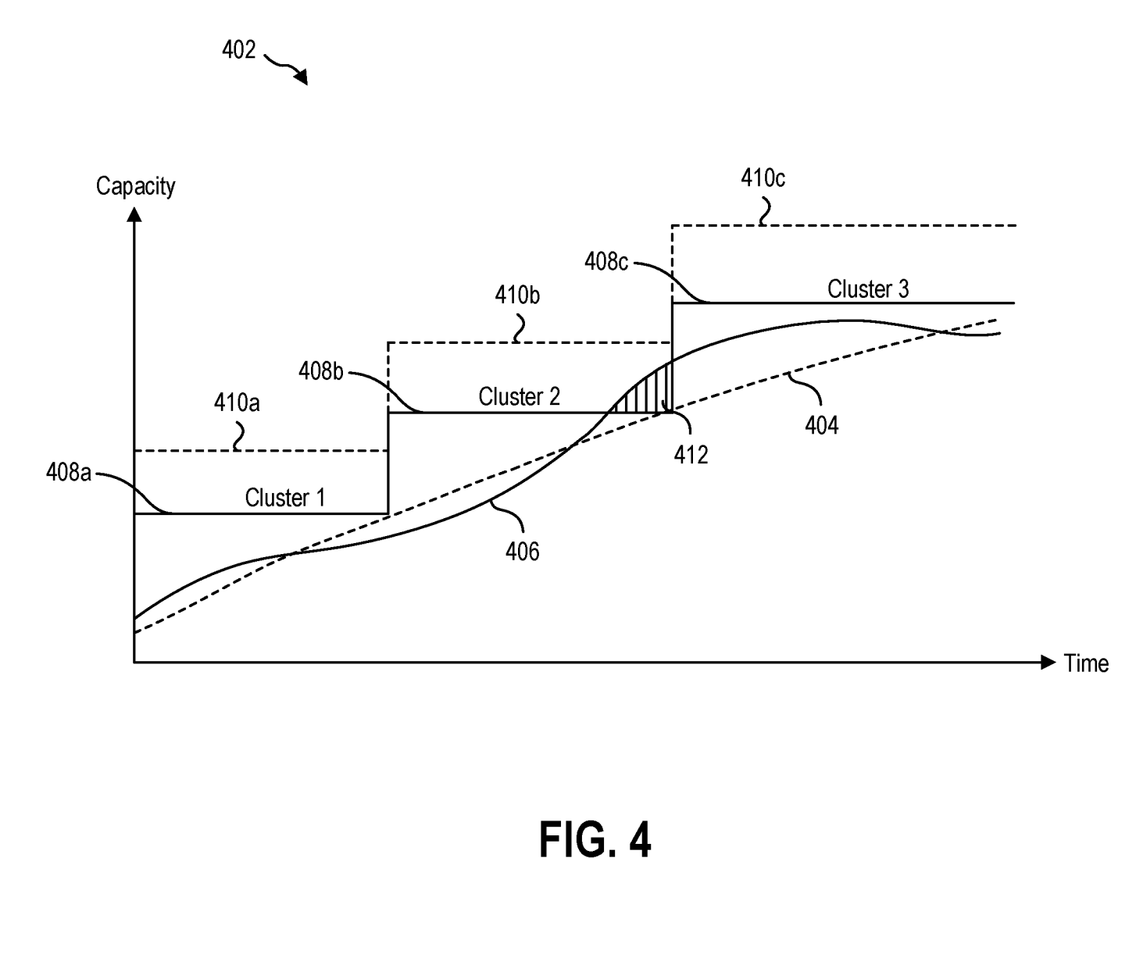
FIG. 4 illustrates an example implementation in which computational bursting is engaged to temporarily increase an available supply computing resources on a computing zone in accordance with one or more embodiments.

Moving on, FIG. 4 illustrates an example implementation showing another benefit provided by the resource allocation system 106 in connection with providing additional compute capacity in one or more embodiments. For example, FIG. 4 illustrates a computing zone capacity graph 402 (or simply "capacity graph 402") showing one or more features of the resource allocation system 106 in connection with providing additional compute capacity beyond a normal threshold capacity of a set of one or more node clusters.

As shown in FIG. 4, the capacity graph 402 shows a predicted demand of computing resources 404 over some period of time relative to an actual demand of computing resources 406 over the same period of time. As shown in FIG. 4, while the actual demand of computing resources 406 approximates the predicted demand of computing resources 404, there are periods of time where the actual demand for computing resources 406 exceeds or falls short of the predicted demand of computing resources 404. While this is not necessarily a problem in many scenarios, it can become a problem where cloud computing capacity for a computing zone is limited for some duration of time. Further, while this problem can be addressed by simply providing an excess of computing capacity, this conventional solution incurs significant costs both in power consumed as well as lost device lifetimes for the server nodes when the server nodes sit for extended periods of time without hosting any VMs or other services.

In this example, the computing zone scales on a per-cluster basis including a first cluster, a second cluster, and a third cluster eventually added to the computing zone over time to accommodate increased demand. As shown in FIG. 4, each of the node clusters may have a corresponding compute capacity associated with normal operation when compute cores are operating at a normal operating speed (e.g., 3 GHz) and a bursting compute capacity associated with a capacity of the clusters when server nodes have engaged a computational bursting mode.

In particular, FIG. 4 shows that the computing zone has a first normal compute capacity 408a and a first bursting compute capacity 410a over a first period of time when the computing zone only includes the first cluster. As further shown, the computing zone has a second normal compute capacity 408b and a second bursting compute capacity 410b over a second period of time when the first and second clusters are online. As further shown, the computing zone has a third normal compute capacity 408c and a third bursting compute capacity 410c over a third period of time when each of the first three node clusters are online.

As shown in FIG. 4, there is a period of time in which the actual demand of computing resources 406 exceeds the normal compute capacity of the computing zone, as denoted by capacity gap 412. In this example, there may be a scheduled addition of the additional computing capacity from the third node cluster or just an unexpected demand of computing resources that exceeds the normal compute capacity of the computing zone for a period of time. In this instance, the resource allocation system 106 may provide allocation instructions causing some portion or all of the node cluster to engage a computational bursting mode for some period of time to accommodate the additional computing demand while waiting for the third node cluster to be added to the computing zone. While engaging a computational bursting mode for an extended period of time while awaiting additional computing capacity may have a detrimental effect on the device lifetimes on the node clusters, this extra computing capability will nonetheless prevent rejected deployment requests or deployment failures on the computing zone until the additional resource capacity is online.

As shown in FIG. 4, once the third node cluster is added to the computing zone, the actual demand of computing resources 406 no longer exceeds the normal compute capacity of the computing zone. Upon identifying this additional demand, the resource allocation system 106 can provide updated allocation instructions to cause migration and/or defragmentation of the VMs between available compute cores to enable the server nodes of the node clusters to continue operating in a normal operating mode, thus providing adequate performance without negatively impacting lifetimes of the server nodes.

Figure 5:
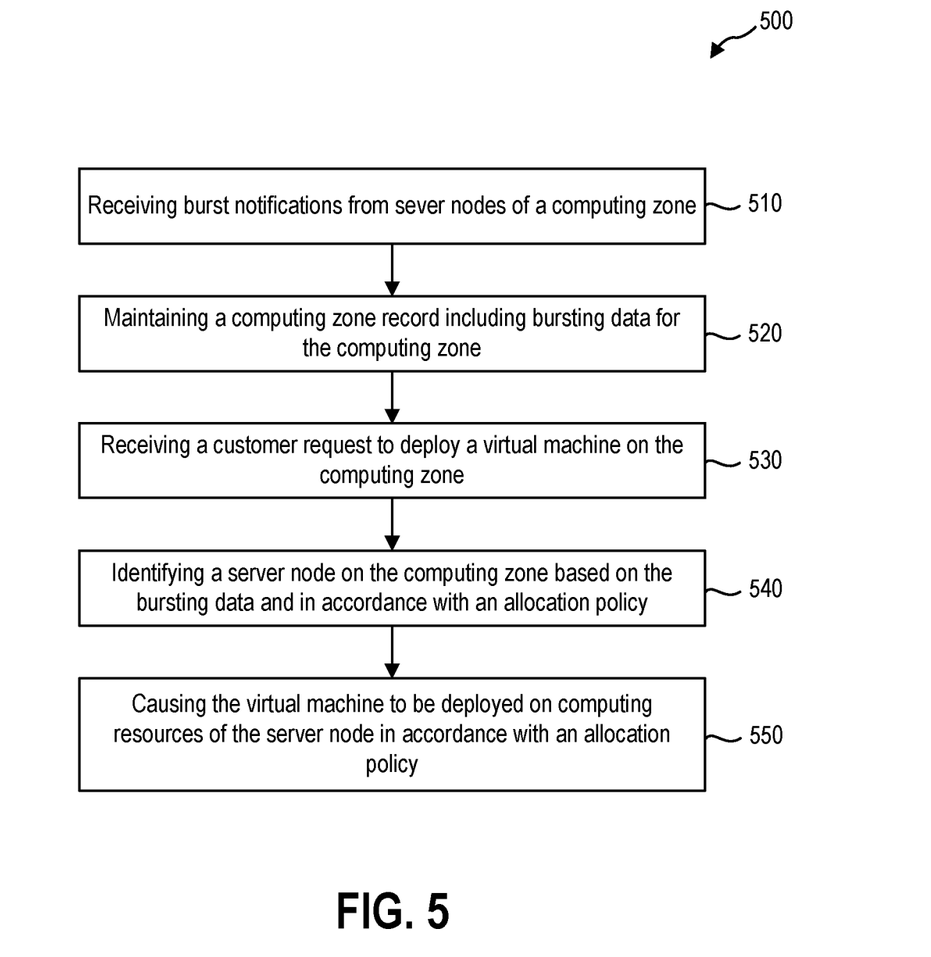
FIG. 5 illustrates a series of acts for engaging lifetime-aware computational bursting on server nodes of a computing zone in accordance with one or more embodiments.

Turning now to FIG. 5, this figure illustrates an example flowchart including a series of acts for collecting bursting data and determining how VMs are to be allocated to server nodes based on the bursting data and an allocation policy in accordance with one or more embodiments described herein. While FIG. 5 illustrates acts according to one or more embodiments, alternative embodiments may omit, add to, reorder, and/or modify any of the acts shown in FIG. 5. The acts of FIG. 5 can be performed as part of a method. Alternatively, a non-transitory computer-readable medium can include instructions that, when executed by one or more processors, cause a computing device to perform the acts of FIG. 5. In still further embodiments, a system can perform the acts of FIG. 5.

As noted above, FIG. 5 shows a series of acts 500 related to collecting bursting data and determining how VMs are to be allocated to server nodes based on the bursting data and an allocation policy. As shown in FIG. 5, the series of acts 500 may include an act 510 of receiving burst notifications from server nodes of a computing zone. For example, in one or more embodiments, the act 510 includes receiving burst notifications from a plurality of server nodes of a computing zone where the burst notifications include computational bursting data from the plurality of server nodes. In one or more embodiments, hardware of the plurality of server nodes is cooled by an immersion cooling system that causes lifetimes of the plurality of server nodes to extend beyond a standard equipment lifetime.

As further shown, the series of acts 500 includes an act 520 of maintaining a computing zone record including bursting data for the computing zone. For example, in one or more embodiments, the act 520 includes maintaining a computing zone record including the computational bursting data for the plurality of server nodes of the computing zone.

As further shown, the series of acts 500 includes an act 530 of receiving a customer request to deploy a virtual machine on the computing zone. The series of acts 500 may include an act 540 of identifying a server node on the computing zone based on the bursting data and in accordance with an allocation policy. For example, responsive to the customer request, the act 540 may include identifying one or more server nodes from the plurality of server nodes based on computational bursting data from the computing zone record.

As further shown, the series of acts 500 may include an act 550 of causing the virtual machine to be deployed on computing resources of the server node in accordance with an allocation policy. For example, in one or more embodiments, the act 550 may include causing the one or more virtual machines to be deployed on computing resources of the one or more server nodes in accordance with the allocation policy.

In one or more embodiments, the burst notifications include, for each server node from the plurality of server nodes, a first duration of time that the server node engaged a first computational bursting mode in which one or more processors of the server node was run above a first threshold speed. In one or more embodiments, the burst notifications include, for each server node from the plurality of server nodes, a second duration of time that the server node engaged a second computational bursting mode in which the one or more processors of the server node was run above a second threshold speed higher than the first threshold speed. In one or more embodiments, running the one or more processors of the server node above the first threshold speed causes a predicted lifetime of the server node to decrease.

In one or more embodiments, the computational bursting data is maintained locally by hardware of the plurality of server nodes. In this example, receiving the bursting notifications may include receiving the burst notifications responsive to instances in which server nodes from the plurality of server nodes engage a computational bursting mode. In addition, or as an alternative, receiving the burst notifications may include polling the plurality of server nodes to obtain a history of burst notifications over a period of time by server nodes of the plurality of server nodes.

In one or more embodiments, maintaining the computing zone record includes determining estimated lifetimes for the plurality of server nodes based on the computational bursting data associated with the plurality of server nodes. In one or more embodiments, the one or more server nodes are identified for allocating the computing resources based on the estimated lifetimes for the one or more server nodes.

In one or more embodiments, the allocation policy includes a rule for densely packing virtual machines beyond a threshold density. Further, in one or more implementations, deploying a set of virtual machines on a given server node causes the given server node to engage a computational bursting mode and reduce a lifetime of the given server node. In one or more embodiments, the series of acts 500 includes determining that the one or more virtual machines are a non-critical virtual machine type. Further, the rule for densely packing virtual machines beyond the threshold density may include a policy for densely packing virtual machines of the non-critical virtual machine type. In one or more embodiments, the series of acts 500 includes determining that a demand for computing resources on the computing zone exceeds a threshold capacity for the computing zone. In one or more embodiments, the rule for densely packing virtual machines beyond the threshold density includes a policy for densely packing virtual machines based on determining that the demand for computing resources on the computing zone exceeds the threshold capacity for the computing zone.

In one or more embodiments, the allocation policy includes a rule for reserving computing capacity on a given server node beyond a threshold computing capacity. In one or more implementations, reserving the computing capacity beyond the threshold enables the given server node to engage a computational bursting mode to guarantee a high threshold level of performance for a given virtual machine. Further, in one or more implementations, the series of acts 500 includes determining that the one or more virtual machines are a critical virtual machine type. In one or more implementations, the rule for reserving computing capacity includes a policy for engaging the computational bursting mode to guarantee the high threshold level of performance for the one or more virtual machines of the critical virtual machine type.

Figure 6:
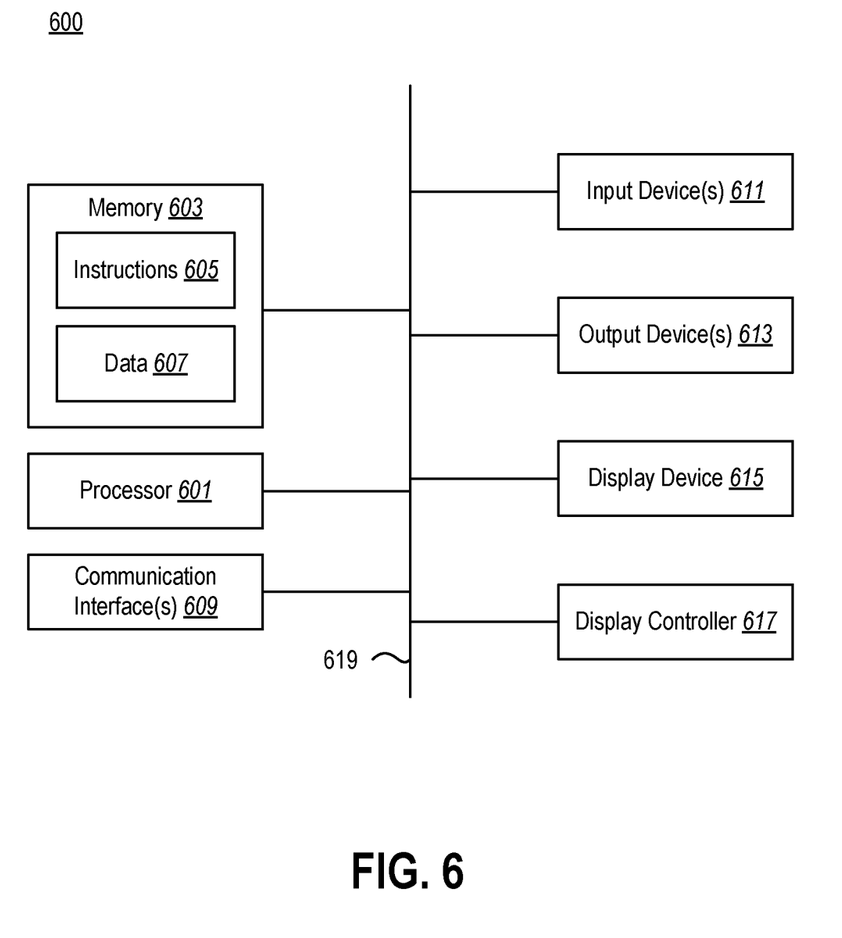
FIG. 6 illustrates certain components that may be included within a computer system.

FIG. 6 illustrates certain components that may be included within a computer system 600. One or more computer systems 600 may be used to implement the various devices, components, and systems described herein.

The computer system 600 includes a processor 601. The processor 601 may be a general-purpose single- or multi-chip microprocessor (e.g., an Advanced RISC (Reduced Instruction Set Computer) Machine (ARM)), a special purpose microprocessor (e.g., a digital signal processor (DSP)), a microcontroller, a programmable gate array, etc. The processor 601 may be referred to as a central processing unit (CPU). Although just a single processor 601 is shown in the computer system 600 of FIG. 6, in an alternative configuration, a combination of processors (e.g., an ARM and DSP) could be used.

The computer system 600 also includes memory 603 in electronic communication with the processor 601. The memory 603 may be any electronic component capable of storing electronic information. For example, the memory 603 may be embodied as random access memory (RAM), read-only memory (ROM), magnetic disk storage media, optical storage media, flash memory devices in RAM, on-board memory included with the processor, erasable programmable read-only memory (EPROM), electrically erasable programmable read-only memory (EEPROM) memory, registers, and so forth, including combinations thereof.

Instructions 605 and data 607 may be stored in the memory 603. The instructions 605 may be executable by the processor 601 to implement some or all of the functionality disclosed herein. Executing the instructions 605 may involve the use of the data 607 that is stored in the memory 603. Any of the various examples of modules and components described herein may be implemented, partially or wholly, as instructions 605 stored in memory 603 and executed by the processor 601. Any of the various examples of data described herein may be among the data 607 that is stored in memory 603 and used during execution of the instructions 605 by the processor 601.

A computer system 600 may also include one or more communication interfaces 609 for communicating with other electronic devices. The communication interface(s) 609 may be based on wired communication technology, wireless communication technology, or both. Some examples of communication interfaces 609 include a Universal Serial Bus (USB), an Ethernet adapter, a wireless adapter that operates in accordance with an Institute of Electrical and Electronics Engineers (IEEE) 802.11 wireless communication protocol, a Bluetooth® wireless communication adapter, and an infrared (IR) communication port.

A computer system 600 may also include one or more input devices 611 and one or more output devices 613. Some examples of input devices 611 include a keyboard, mouse, microphone, remote control device, button, joystick, trackball, touchpad, and lightpen. Some examples of output devices 613 include a speaker and a printer. One specific type of output device that is typically included in a computer system 600 is a display device 615. Display devices 615 used with embodiments disclosed herein may utilize any suitable image projection technology, such as liquid crystal display (LCD), light-emitting diode (LED), gas plasma, electroluminescence, or the like. A display controller 617 may also be provided, for converting data 607 stored in the memory 603 into text, graphics, and/or moving images (as appropriate) shown on the display device 615.

The various components of the computer system 600 may be coupled together by one or more buses, which may include a power bus, a control signal bus, a status signal bus, a data bus, etc. For the sake of clarity, the various buses are illustrated in FIG. 6 as a bus system 619.

The techniques described herein may be implemented in hardware, software, firmware, or any combination thereof, unless specifically described as being implemented in a specific manner. Any features described as modules, components, or the like may also be implemented together in an integrated logic device or separately as discrete but interoperable logic devices. If implemented in software, the techniques may be realized at least in part by a non-transitory processor-readable storage medium comprising instructions that, when executed by at least one processor, perform one or more of the methods described herein. The instructions may be organized into routines, programs, objects, components, data structures, etc., which may perform particular tasks and/or implement particular data types, and which may be combined or distributed as desired in various embodiments.

Computer-readable media can be any available media that can be accessed by a general purpose or special purpose computer system. Computer-readable media that store computer-executable instructions are non-transitory computer-readable storage media (devices). Computer-readable media that carry computer-executable instructions are transmission media. Thus, by way of example, and not limitation, embodiments of the disclosure can comprise at least two distinctly different kinds of computer-readable media: non-transitory computer-readable storage media (devices) and transmission media.

As used herein, non-transitory computer-readable storage media (devices) may include RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

The steps and/or actions of the methods described herein may be interchanged with one another without departing from the scope of the claims. In other words, unless a specific order of steps or actions is required for proper operation of the method that is being described, the order and/or use of specific steps and/or actions may be modified without departing from the scope of the claims.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element or feature described in relation to an embodiment herein may be combinable with any element or feature of any other embodiment described herein, where compatible.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method, comprising:
receiving burst notifications from a plurality of server nodes of a computing zone, the burst notifications including computational bursting data from the plurality of server nodes, wherein the computational bursting data is tracked and maintained locally by each of the plurality of server nodes and transmitted by each of the plurality of server nodes in response to each of the plurality of server nodes engaging in computational bursting at one or more levels;
maintaining a computing zone record including the computational bursting data for the plurality of server nodes of the computing zone;
determining, based on the computational bursting data, a lifetime for each of the plurality of server nodes, wherein the lifetime is based on a duration of the computational bursting of each server node at the one or more levels;
receiving a customer request to deploy one or more virtual machines on the computing zone;
identifying one or more server nodes from the plurality of server nodes based on a remaining lifetime of the one or more server nodes; and
causing the one or more virtual machines to be selectively deployed on computing resources of the one or more server nodes in accordance with an allocation policy, wherein the allocation policy includes rules for allocating the one or more virtual machines such that the one or more server nodes engage in a high-bursting workload based on the remaining lifetime of the one or more server nodes.

2. The method of claim 1, wherein hardware of the plurality of server nodes is cooled by an immersion cooling system that causes lifetimes of the plurality of server nodes to extend beyond a standard equipment lifetime.

3. The method of claim 1, wherein the burst notifications include, for each server node from the plurality of server nodes, a first duration of time that the server node engaged a first computational bursting mode in which one or more processors of the server node was run above a first threshold speed.

4. The method of claim 3, wherein the burst notifications include, for each server node from the plurality of server nodes, a second duration of time that the server node engaged a second computational bursting mode in which the one or more processors of the server node was run above a second threshold speed higher than the first threshold speed.

5. The method of claim 3, wherein running the one or more processors of the server node above the first threshold speed causes a predicted lifetime of the server node to decrease.

6. The method of claim 1, further comprising receiving additional burst notifications from the plurality of server nodes of the computing zone by
polling the plurality of server nodes to obtain a history of burst notifications over a period of time by server nodes of the plurality of server nodes.

7. The method of claim 1, wherein:
the one or more server nodes include a first capacity associated with an operation of the server nodes at or below a threshold operational frequency of the server nodes and a second capacity associated with an operation of the server nodes above the threshold operational frequency of the server nodes; and
the high-bursting workload includes operating the one or more virtual machines by utilizing the first capacity and at least some of the second capacity to increase the performance of the one or more virtual machines.

8. The method of claim 7, wherein:
the one or more virtual machines includes a first subset of virtual machines, a second subset of virtual machines; and
the high-bursting workload further includes operating the first subset of virtual machines by utilizing the first capacity of the server nodes and operating the second subset of virtual machines by utilizing the second capacity of the server nodes in order to increase a density of virtual machines deployed on the server nodes.

9. The method of claim 1, wherein:
the one or more server nodes includes a first capacity associated with an operation of the server nodes at or below a threshold operational frequency of the server nodes and a second capacity associated with an operation of the server nodes above the threshold operational frequency of the server nodes;
the one or more server nodes includes a first subset of server nodes for deploying the one or more virtual machines, and a second subset of server nodes reserved as an emergency buffer; and
the high-bursting workload includes:
deploying the one or more virtual machines on the first subset of server nodes;
receiving an additional customer request to deploy one or more additional virtual machines on the computing zone;
deploying the one or more additional virtual machines on the second subset of server nodes;
operating the one or more virtual machines and the one or more additional virtual machines by utilizing the second capacity of the first subset of server nodes and the first capacity of the second subset of server nodes; and
reserving the second capacity of the second subset of server nodes as the emergency buffer.

10. The method of claim 9, further comprising:
determining that the one or more virtual machines are a non-critical virtual machine type, and
wherein a rule for densely packing virtual machines beyond the a threshold density includes a policy for densely packing virtual machines of the non-critical virtual machine type.

11. The method of claim 9, further comprising:
determining that a demand for computing resources on the computing zone exceeds a threshold capacity for the computing zone, and
wherein a rule for densely packing virtual machines beyond a threshold density includes a policy for densely packing virtual machines based on determining that the demand for computing resources on the computing zone exceeds the threshold capacity for the computing zone.

12. The method of claim 1, wherein the allocation policy includes a rule for reserving computing capacity on a given server node beyond a threshold computing capacity, wherein reserving the computing capacity beyond the threshold computing capacity enables the given server node to engage a computational bursting mode to guarantee a high threshold level of performance for a given virtual machine.

13. The method of claim 12, further comprising:
determining that the one or more virtual machines are a critical virtual machine type; and
wherein the rule for reserving computing capacity includes a policy for engaging the computational bursting mode to guarantee the high threshold level of performance for the one or more virtual machines of the critical virtual machine type.

14. A system, comprising:
one or more processors;
memory in electronic communication with the one or more processors; and
instructions stored in the memory, the instructions being executable by the one or more processors to:
receive burst notifications from a plurality of server nodes of a computing zone, the burst notifications including computational bursting data from the plurality of server nodes, wherein the computational bursting data is tracked and maintained locally by each of the plurality of server nodes and transmitted by each of the plurality of server nodes in response to each of the plurality of server nodes engaging in computational bursting at one or more levels;
maintain a computing zone record including the computational bursting data for the plurality of server nodes of the computing zone;
determine, based on the computational bursting data, a lifetime for each of the plurality of server nodes, wherein the lifetime is based on a duration of the computational bursting of each server node and the one or more levels of computational bursting;
receive a customer request to deploy one or more virtual machines on the computing zone;
identify one or more server nodes from the plurality of server nodes based on a remaining lifetime of the one or more server nodes; and
cause the one or more virtual machines to be selectively deployed on computing resources of the one or more server nodes in accordance with an allocation policy, wherein the allocation policy allocates the one or more virtual machines such that the plurality of server nodes engage in a high-bursting workload based on the remaining lifetime of the plurality of server nodes.

15. The system of claim 14, wherein hardware of the plurality of server nodes is cooled by an immersion cooling system that causes lifetimes of the plurality of server nodes to extend beyond a standard equipment lifetime.

16. The system of claim 14, wherein the burst notifications include, for each server node from the plurality of server nodes, a first duration of time that the server node engaged a first computational bursting mode in which one or more processors of the server node was run above a first threshold speed.

17. The system of claim 14, wherein:
the one or more server nodes include a first capacity associated with an operation of the server nodes at or below a threshold operational frequency of the server nodes and a second capacity associated with an operation of the server nodes above the threshold operational frequency of the server nodes; and
the high-bursting workload includes operating the one or more virtual machines by utilizing the first capacity and at least some of the second capacity to increase the performance of the one or more virtual machines.

18. The system of claim 17, wherein:
the one or more virtual machines includes a first subset of virtual machines, a second subset of virtual machines; and
the high-bursting workload further includes operating the first subset of virtual machines by utilizing the first capacity of the server nodes and operating the second subset of virtual machines by utilizing the second capacity of the server nodes in order to increase a density of virtual machines deployed on the server nodes.

19. A non-transitory computer readable medium storing instructions thereon that, when executed by one or more processors, causes the one or more processors to:
Receive burst notifications from a plurality of server nodes of a computing zone, the burst notifications including computational bursting data from the plurality of server nodes, wherein the computational bursting data is tracked and maintained locally by each of the plurality of server nodes and transmitted by each of the plurality of server nodes in response to each of the plurality of server nodes engaging in computational bursting at one or more levels;
maintain a computing zone record including the computational bursting data for the plurality of server nodes of the computing zone;
determine, based on the computational bursting data, a lifetime for each of the plurality of server nodes, wherein the lifetime is based on a duration of the computational bursting of each server node and the one or more levels of computational bursting;
receive a customer request to deploy one or more virtual machines on the computing zone;
identify one or more server nodes from the plurality of server nodes based on remaining lifetime of the one or more server nodes; and
cause the one or more virtual machines to be selectively deployed on computing resources of the one or more server nodes in accordance with an allocation policy, wherein the allocation policy allocates the one or more virtual machines such that the plurality of server nodes engage in a high-bursting workload based on the remaining lifetime of the plurality of server nodes.

20. The non-transitory computer readable medium of claim 19,
wherein maintaining the computing zone record includes determining estimated lifetimes for the plurality of server nodes based on the computational bursting data associated with the plurality of server nodes, and
wherein the one or more server nodes are identified for allocating the computing resources based on the estimated lifetimes for the one or more server nodes.

* * * * *